United States Patent
Maleville et al.

(10) Patent No.: US 6,903,032 B2
(45) Date of Patent: Jun. 7, 2005

(54) METHOD FOR PREPARING A SEMICONDUCTOR WAFER SURFACE

(75) Inventors: Christophe Maleville, La Terrasse (FR); Eric Neyret, Sassenage (FR)

(73) Assignee: S.O.I.TEC Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/754,930

(22) Filed: Jan. 8, 2004

(65) Prior Publication Data

US 2004/0161948 A1 Aug. 19, 2004

Related U.S. Application Data

(63) Continuation of application No. PCT/FR02/02543, filed on Jul. 16, 2002.

(30) Foreign Application Priority Data

Jul. 16, 2001 (FR) .............................................. 01 09495

(51) Int. Cl.[7] .......................... H01L 21/26; H01L 21/44
(52) U.S. Cl. ...................... 438/796; 438/660; 438/677
(58) Field of Search .......................... 438/38, 71, 477, 438/458–459, 522, 550, 660, 677, 795–799, 928, 974

(56) References Cited

U.S. PATENT DOCUMENTS

| 5,374,564 | A | | 12/1994 | Bruel | 437/24 |
| 5,989,981 | A | * | 11/1999 | Nakashima et al. | 438/459 |
| 6,362,076 | B1 | | 3/2002 | Inazuki et al. | 438/458 |
| 6,372,609 | B1 | | 4/2002 | Aga et al. | 438/459 |
| 6,403,450 | B1 | | 6/2002 | Maleville et al. | 438/471 |
| 6,566,198 | B2 | * | 5/2003 | Park et al. | 438/259 |

FOREIGN PATENT DOCUMENTS

| DE | 19753494 | 10/1998 |
| EP | 0954014 | 11/1999 |
| EP | 1045448 | 10/2000 |
| EP | 1158581 | 11/2001 |
| FR | 2761526 | 10/1998 |
| FR | 2777115 | 10/1999 |
| FR | 2797713 | 2/2001 |
| WO | WO 01/15215 | 3/2001 |
| WO | WO 01/28000 | 4/2001 |

* cited by examiner

Primary Examiner—David Nelms
Assistant Examiner—Calvin Lee
(74) Attorney, Agent, or Firm—Winston & Strawn LLP

(57) ABSTRACT

A method for preparing a semiconductor wafer wherein rapid thermal annealing is conducted to smooth a free surface of a superficial zone that is supported by the wafer. The improvement includes treating the superficial zone before conducting the rapid thermal annealing to prevent pitting in the superficial zone during the rapid thermal annealing.

19 Claims, 1 Drawing Sheet

METHOD FOR PREPARING A SEMICONDUCTOR WAFER SURFACE

CROSS-REFERENCE TO RELATED APPLICATIONS

This application is a continuation of International application PCT/FR02/02543 filed Jul. 16, 2002, the entire content of which is expressly incorporated herein by reference thereto.

BACKGROUND ART

The present invention generally concerns the surface treatment of semiconductor materials, and particularly treating the surface of substrates intended for the fabrication of components for microelectronic and/or optoelectronic applications. More precisely, the invention concerns a technique for enhancing the condition of the free surface of a semiconductor wafer, wherein the method includes a rapid thermal annealing step to smooth the free surface.

The term "free surface" means the surface of a wafer which is exposed to the outside environment (as compared with an interface surface which is in contact which the surface of another wafer or another element). The term "rapid thermal annealing" means rapid annealing in a controlled atmosphere, following a method that is conventionally known as the RTA method, which is the abbreviation for Rapid Thermal Annealing. In the remainder of this description, this method shall be called rapid thermal annealing or RTA.

RTA annealing of a wafer of material typically means that the wafer is annealed at a high temperature, which may be in the region of 1100° C. to 1300° C. for 1 to 60 seconds. RTA annealing is conducted in a controlled atmosphere. For example, the atmosphere may contain a mixture of hydrogen and argon, or an atmosphere of pure argon.

A method for producing a semiconductor wafer is the SMART-CUT® method. Its main steps include implanting atoms under a surface of a semiconductor substrate (silicon in particular) in an implantation zone of the substrate, bonding by close contact the implanted substrate with a stiffener, and detaching the implanted substrate at the implantation zone. Thus, that part of the substrate located between the surface submitted to implantation and the implantation zone is transferred onto the stiffener to form a thin film, or a layer, of semiconductor material upon the stiffener. Atomic implantation means any bombardment of atom or ion species capable of inserting these species into the wafer material with a maximum concentration of implanted species located at a predetermined depth of the wafer relative to the bombarded surface to define a weakened zone. The depth of the weakened zone depends upon the type of species implanted, and on their implanting energy.

The general term "wafer" may mean the film or layer that is transferred by using a method of the SMART-CUT® type. The semiconductor wafer may therefore be associated with a stiffener and optionally with other intermediate layers. The term "wafer" also covers any wafer, layer or film of semiconductor material such as silicon, whether or not the wafer has been produced by a method of the SMART-CUT® type.

For the applications mentioned above, the roughness specifications associated with the free surface of wafers are very stringent. The roughness of the free surface of wafers is a parameter which, to a certain extent, determines the quality of the components which are to be made on the wafer. It is therefore common to find roughness specifications which do not exceed 5 Angstroms in rms value (the abbreviation rms stands for "root mean square").

Roughness measurements are generally made using an Atomic Force Microscope ("AFM"). This type of apparatus is used to measure roughness on surfaces by scanning a tip of the AFM microscope, and the measurement ranges from $1\times1$ $\mu m^2$ to $10\times10$ $\mu m^2$, and typically $50\times50$ $\mu m^2$, and sometimes $100\times100$ $\mu m^2$.

Roughness can be characterized according to two modalities. First, roughness is said to be high frequency and relates to scanned surfaces on the order of $1\times1$ $\mu m^2$. Second, roughness is said to be low frequency and relates to scanned surfaces on the order of $10\times10$ $\mu m^2$ or greater. The 5-Angstrom specification given above by way of example therefore corresponds to a roughness of a scanned surface of $10\times10$ $\mu m^2$.

Wafers produced using known methods (such as SMART-CUT® or other methods) have surface roughness values which are greater than those mentioned above, unless the surface is subjected to a specific treatment such as polishing. A first known method for reducing the roughness of wafer surfaces consists of submitting the wafer to "conventional" heat treatment (sacrificial oxidation for example). But such treatment does not make it possible to reduce the wafer roughness to the level of the above-mentioned specifications. In order to further reduce roughness, it is possible to envisage increasing the number of conventional heat treatment steps and/or combining them with other known methods. But such techniques lead to a method that is lengthy and complex.

A second known method consists of subjecting the free surface of the wafer to chemical-mechanical polishing. This method can indeed reduce the roughness of the free surface of the wafer. However, if a defect concentration gradient that increases towards the free surface of the wafer exists, this second method can also abrade the wafer down to a zone that presents an acceptable concentration of defects. But this second known method can compromise the uniformity of the free surface of the wafer. This drawback is worsened when a large amount of polishing is performed on the surface of the wafer, as would be necessary to reach the roughness levels mentioned above.

A third method concerns subjecting the wafer to RTA annealing in a controlled atmosphere. This third method permits, in generally satisfactory manner, reduction of the surface roughness of wafers (in particular without deteriorating the thickness uniformity of the effective layer) and this therefore offers a solution of interest. However, while it is indeed possible to achieve globally satisfactory high frequency and low frequency roughness values with this third method, it has been observed that submitting the wafer to RTA annealing can lead to a disadvantage. In particular, on fine analysis of the surface condition of wafers (silicon wafers in particular) which have undergone such treatment, it has been found that holes of very small size were superimposed on a surface whose general roughness was otherwise satisfactory. Such analysis can be made by observation through an atomic force microscope. These small holes typically have a size on the order of a few nm in depth and a few dozen nm in diameter. These holes are similar to the holes that can sometimes be observed on the surface of materials such as silicon and which are attributed to a so-called 'pitting' phenomenon.

The term "pitting" will be used in this description for reasons of practicality, and it should be understood that the depth to diameter ratio of these small holes is less than the ratios usually encountered in conventional cases of pitting. More precisely, the "pitting" at issue herein does not have the same cause as the "pitting" phenomenon which is generally described in the state of the art. Pitting in the state of the art is generally due to defects embedded in the thickness of the wafer material. These defects may be attacked by heat treatment (for example heat treatment to improve the surface condition of the wafer). Therefore, in the state of the art, the phenomenon of pitting relates to holes generated by the attack of embedded defects. In this respect, reference may be made to PCT application WO01/28000 which specifies the characteristics of these embedded defects; in particular defects of the "COP" type, wherein COP stands for "Crystal Originated Particle". Reference may be made for example to the passage on page 1 lines 48 to 54 of this patent application. It should also be noted that this application only sets out to improve the "long period" components of roughness, which relate to low frequency roughness (scanned surfaces in the order of 10×10 $\mu m^2$) whereas high frequency components of roughness are not treated (see in particular page 10 lines 54–55 of this application). Yet the phenomenon designated as "pitting" in this description also relates to high frequency roughness.

In other documents, for example U.S. Pat. No. 6,372,609 or PCT application WO01/15215, the same treatment objective for conventional "pitting" is also described. Consequently, in these documents, the term "pitting" is not the same "pitting" which is addressed by the present invention.

For example U.S. Pat. No. 6,372,609 specifies that the targeted defects are of the "COP" type, which are embedded defects and the attack used is likely to generate fairly deep holes. U.S. Pat. No. 6,372,609 therefore specifies (see, for example, column 2, line 55 to column 3, line 24) that COPS may extend down to the embedded oxide layer of a structure of SOI type (that is to say that these defects may extend into the thickness of the material as far as the embedded oxide layer which is located underneath an effective layer of silicon whose thickness may typically reach a few thousand angstroms). The corresponding "pitting" holes, in the case of U.S. Pat. No. 6,372,609, therefore have a depth that may possibly reach these values of a few thousand angstroms. Therefore "pitting" as understood in the state of the art designates holes that are generated by the attack of defects embedded in the thickness of the wafer layer, wherein such holes may have a depth on the order of a few thousand angstroms. Conversely, the "pitting" of concern in the present application does not result from the attack of pre-existing defects, but only relates to places on the wafer surface on which reconstruction smoothing by RTA annealing is not fully achieved, causing the onset of the small holes mentioned above. The "pitting" at issue herein is therefore a purely superficial phenomenon.

SUMMARY OF THE INVENTION

The invention relates to an improvement in a method for preparing a semiconductor wafer wherein rapid thermal annealing is conducted to smooth a free surface of a superficial zone that is supported by the wafer. The improvement includes treating the superficial zone before conducting the rapid thermal annealing to prevent pitting in the superficial zone during the rapid thermal annealing.

In a beneficial implementation, the method also includes conducting the rapid thermal annealing step in a non-reducing atmosphere. It is also advantageous for the treating to be a high temperature annealing operation to reconstruct the superficial zone. The high temperature annealing may be conducted in a neutral atmosphere, and may occur at a temperature in the range of between about 600° C. and about 1300° C.

In another advantageous embodiment, the treating step includes removing a disturbed portion of the superficial zone. The disturbed portion may be removed by chemical attack, which may include at least one of wet etching or dry etching. The chemical attack could also include sacrificial oxidation, wherein the sacrificial oxidation includes an oxidation step, a heat treatment step, and a deoxidation step. The oxidation step may be conducted at a temperature in the range of between about 700° C. and about 1100° C. The heat treatment step could be conducted under at least one of a constant temperature or a variable temperature, and could be conducted at any temperature in the range of between about 900° C. and about 1300° C. In another beneficial variation, the oxidation step may begin with a temperature rise leading to the heat treatment step, and wherein the oxidation step ends before the heat treatment step so that the oxidation step at least partially overlaps the heat treatment step. Advantageously, the deoxidation step is conducted in a solution for a time sufficient to remove oxides in a thickness range of about one thousand to a few thousand angstroms. The solution may be at least one of a 10% or a 20% hydrofluoric acid solution.

In another beneficial variation, the method also includes a sacrificial oxidation step after the rapid thermal annealing. The superficial zone could be a transferred layer or a grown layer, and the wafer may be of a SOI or a SOA structure.

In an advantageous application of the invention, the present method is implemented in combination with a method for fabricating thin films or layers of semiconductor material of the type described in U.S. Pat. No. 5,374,564. One such method according to the teaching of U.S. Pat. No. 5,374,564 is known as the SMART-CUT® method, wherein a useful layer is transferred to a substrate.

BRIEF DESCRIPTION OF THE DRAWING

Other aspects, purposes and advantages of the invention will become clear after reading the following detailed description with reference to the attached drawing, in which.

DETAILED DESCRIPTION OF THE PREFERRED EMBODIMENTS

Figure 1:
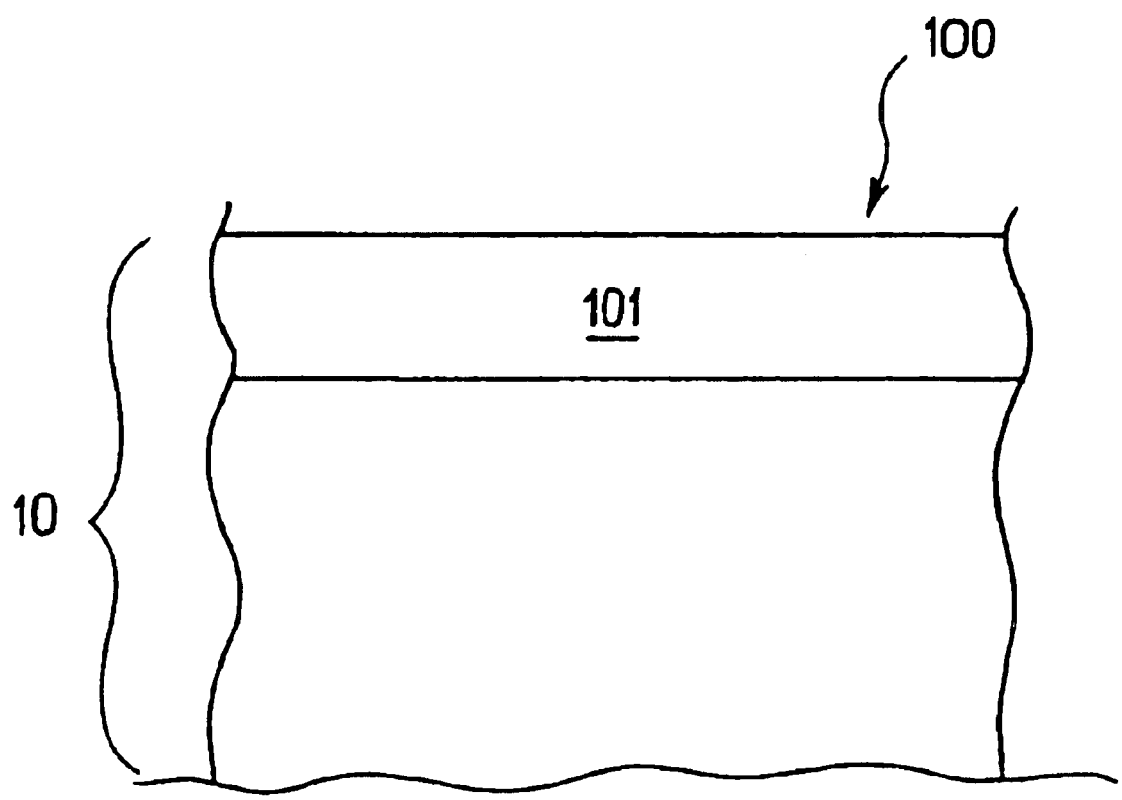
FIG. 1 is an enlarged, cross-sectional view of a silicon wafer having a surface that has been formed after a transfer process and then exposed to an RTA annealing step.

FIG. 1 shows a cross-section view of a silicon wafer 10 having a surface 100, formed after a transfer process, and then subjected to a RTA annealing step. A superficial zone 101 has a thickness of less than 100 nm, in which the silicon structure is no longer crystalline. It is this very narrow zone 101 which is prone to pitting as defined above in this description. FIG. 1 illustrates the difference between the "pitting" that occurs when using state of the art methods and the "pitting" that results from use of the present method. The term "pitting" is used herein as specifically defined above and not as understood in the prior art (unless otherwise indicated).

It has been found that the application of RTA annealing to a wafer (in particular a silicon wafer) promotes the onset of a pitting phenomenon. Pitting was observed in particular with regard to SOI wafers (Silicon-On-Insulator wafers) or SOA wafers (Silicon-On-Anything) resulting from using a method of the SMART-CUT® type. When RTA annealing is used as the last step to smooth the surface condition of the wafer, the pitting of a wafer surface after RTA annealing is a problem since such a "pitted" surface will exist in the end product. It is possible to contemplate re-treating the wafers derived from RTA annealing to correct this phenomenon, and to try to remove the pitting by polishing away a sufficient thickness of the pitted wafer. But such operation would again give rise to the disadvantages associated with polishing mentioned above (as described in published document PCT application WO01/15215) and in this case the benefits connected with RTA annealing would be lost.

One purpose of the present method is to improve the techniques for enhancing the condition of the free surface of a semiconductor wafer by RTA annealing. More precisely, the present method frees such methods from the disadvantage related to pitting mentioned above. The present method is particularly beneficial when applied to surfaces of wafers of SOI (or SOA) type wafers that result from using a transfer method wherein a useful layer is detached from a substrate (for example, by using a SMART-CUT® type method). The present method is also an alternative to methods that use a polishing step.

To attain the objectives set forth above, the present method enhances the condition of the free surface of a semiconductor wafer by using a rapid thermal annealing step to smooth the free surface. Before rapid thermal annealing occurs, a superficial zone of the wafer is treated to prevent the onset of pitting during rapid thermal annealing. The rapid thermal annealing can be conducted in a non-reducing atmosphere.

Some preferred, but non-limiting aspects of the method include a prior treatment step of high temperature annealing that reconstructs the superficial zone. This high temperature annealing may be conducted in a neutral atmosphere, and may occur at a temperature of between about 600° C. and about 1300° C. In an embodiment, the temperature of the high temperature annealing lies between about 800° C. and 1100° C.

The prior treatment step makes it possible to remove a disturbed portion of the superficial zone. In a variation, the prior treatment may be a chemical attack, may be a wet etching or a dry etching type, or may be a sacrificial oxidation step. The rapid thermal annealing step may be followed by sacrificial oxidation. A SOI or SOA structure may be obtained by using the present method.

This description is made with reference to a preferred application of the invention, which concerns enhancing the surface condition of a SOI or SOA wafer formed by using a SMART-CUT® method. However, the wafer may be formed in a different manner.

One common characteristic of the different embodiments is that the surface of the wafer is prepared prior to a RTA annealing step which is conducted to reduce the surface roughness of the wafer. RTA annealing may in particular be conducted in an atmosphere of a hydrogen/argon mixture, or pure argon. This RTA annealing may therefore be conducted in a non-reducing atmosphere. It is noted that this characteristic forms an additional difference from the teaching of U.S. Pat. No. 6,372,609 and U.S. Pat. No. 6,362,076 (these patents have been cited only because they are concerned with "pitting" as defined in the state of the art, and not by the "pitting" as defined in this description). It is also specified that the disclosure of U.S. Pat. No. 6,372,609 does not teach to treat a wafer to prevent the onset of pitting, but rather teaches curative treatment intended to cure existing defects. Further, U.S. Pat. No. 6,362,076 does not teach to treat a wafer to specifically prevent the onset of any pitting before RTA annealing. The above document limits its teaching to the application of RTA annealing. This also applies to the teaching of published document FR 2,761,526.

If a wafer has been produced by detachment by using the SMART-CUT® method, the surface of the wafer "as detached" has irregularities which may be reduced by RTA annealing. In a first embodiment of the present method, the surface of the wafer is prepared using high temperature annealing in a neutral atmosphere, before RTA annealing. The atmosphere of this prior annealing may be an argon or nitrogen atmosphere. This prior annealing is applied to the surface of the wafer, which is arranged such that it is exposed to the annealing. During this prior annealing, the temperature may lie between about 600° C. and about 1300° C., and preferably the temperature lies between about 800° C. and about 1100° C. The prior annealing may also be conducted in a vacuum, and the pressure may have any value of up to 1 atmosphere.

The prior annealing step makes it possible to reconstruct the disturbed zone of the wafer surface and to remove defects which would lead to pitting during RTA annealing. These defects, which are generated during detachment of the wafer, have been observed by using an electron transmission microscope that makes it possible to see details on the order of magnitude of one atom, in the form of cavities in the superficial zone of the wafer, on wafer surfaces created by using a SMART-CUT® method. These cavities are grouped together in the superficial zone of the wafer which has a thickness on the order of several dozen nm. Due to the presence of these cavities, the superficial zone is a disturbed zone as compared to the lower regions of the wafer whose crystalline structure is not disturbed. These cavities may have a diameter on the order of 10 to 20 nm. The prior annealing step may be conducted in a conventional furnace (but RTA annealing to smooth the surface is subsequently conducted in a specific furnace) or in the same furnace as RTA annealing.

According to a second embodiment of the invention, a chemical attack of the wafer surface is conducted before RTA annealing. This chemical attack may be a wet etching or a dry etching type. In this case, the prior treatment (chemical attack) removes the superficial zone of the wafer which contains the cavities mentioned above, and which cause the pitting phenomenon under RTA annealing.

In all of the embodiments of the invention, the purpose of the treatment which occurs prior to RTA annealing is to treat the superficial zone which has a disturbed structure due to the presence of cavities. This treatment of the superficial zone may consist of reducing or removing the cavities (this is the case in the first embodiment) or of directly attacking the superficial zone to reduce and/or remove this zone itself (this is the case in the second embodiment and, as will be seen later, the third embodiment as well).

According to a third embodiment, the wafer is submitted to sacrificial oxidation prior to RTA annealing. In this third embodiment, the effect of sacrificial oxidation is again to reduce or to remove not only the cavities of the disturbed superficial zone, but to reduce or remove the disturbed superficial zone itself. Therefore, submitting the wafer to sacrificial oxidation before RTA annealing contributes towards reducing and/or removing the disturbed zone (it is also possible for this sacrificial oxidation step to contribute towards reducing or removing the cavities of this zone).

In one preferred variant of the third embodiment, the sacrificial oxidation step is divided into an oxidation step and a deoxidation step, wherein a heat treatment is inserted between the oxidation step and the deoxidation step. The oxidation step is preferably conducted at a temperature of between 700° C. and 1100° C. The oxidation step may be performed by a dry route or by a wet route. For example, a dry route oxidation step is performed by heating the wafer under gaseous oxygen. A wet route oxidation step may be conducted, for example, by beating the wafer in an atmosphere containing water vapor. Whether by dry route or by wet route, according to conventional known methods, the oxidation atmosphere may also contain hydrochloric acid. The oxidation step leads to the formation of an oxide on the surface of the wafer.

The heat treatment step may be conducted using any heat operation intended to improve the qualities of the material that form the superficial zone of the wafer. This heat treatment may be conducted under constant or variable temperature. For example, heat treatment may be performed by gradually raising the temperature between two values or by cyclically oscillating the temperature between two values, and the like. Preferably, the heat treatment step is conducted at least in part at a temperature greater than about 1000° C., and more particularly at about 1100 to about 1200° C. Preferably, the heat treatment step is conducted in a non-oxidizing atmosphere. The atmosphere of the heat treatment may contain argon, nitrogen, hydrogen, or other gases, or it may contain a mixture of these gases. Heat treatment may also be conducted in a vacuum. In this preferred variant of the third embodiment of the invention, the oxidation step is conducted before the heat treatment step.

It is to be noted that consideration may already have been given to reducing pitting that is specifically due to the heat treatment step of such a sacrificial oxidation technique. However, the present method prevents pitting that would have occurred due to a subsequent RTA annealing step. Moreover, it is recalled in this respect that the "pitting" which may be caused by sacrificial oxidation is "true" pitting (in which the holes are deeper than they are wide), whereas the holes under consideration, whose onset subsequent to RTA annealing are prevented, are generally wider than they are deep.

According to one advantageous variant, the oxidation step begins with a temperature rise for heat treatment and ends before the latter ends. Heat treatment can be used to cure, at least in part, the defects that are generated during the preceding fabrication process steps and wafer treatment. More particularly, heat treatment can be conducted for a time and at a temperature such that it can cure crystalline defects such as stacking faults, "HF" faults, etc., generated in the superficial layer of the wafer during the oxidation step. A "HF" defect is a defect whose presence is revealed by a decorative halo in a layer such as an oxide layer embedded in the thickness of the wafer, after treatment of the wafer in a hydrofluoric acid bath.

The deoxidation step is preferentially conducted in a solution. This solution may be, for example, a 10% or 20% hydrofluoric acid solution. A few minutes of immersion of the wafer in this solution are sufficient to remove one thousand to a few thousand angstroms of oxide.

In the different embodiments of the invention, the RTA annealing step may be followed by sacrificial oxidation such as described above (in this case, if the third embodiment of the invention is used, two sacrificial oxidation operations will be conducted). The addition of a sacrificial oxidation step after RTA annealing makes it possible to thin the effective layer of the wafer to reduce it to a desired thickness. It is chiefly by acting on the oxidation time that it is possible to determine the thickness to be removed from the effective layer of the wafer.

It will therefore be understood that the present invention, in each of its different embodiments, treats the superficial zone (particularly in the case of SOI or SOA structures created by using SMART-CUT® methods) to prevent the subsequent onset of pitting during RTA annealing. In each of these embodiments, the present invention results in a major improvement of the surface morphology of wafers which have undergone RTA annealing. This annealing enhances the roughness of wafers and, on a finer scale, the invention results in the added advantage of preventing the onset of pitting.

What is claimed is:

1. In a method for preparing a semiconductor wafer wherein rapid thermal annealing is conducted to smooth a free surface of the wafer, the improvement which comprises removing a superficial zone having a thickness of less than about 100 nm before conducting the rapid thermal annealing to prevent formation of small holes or voids in the wafer surface in the superficial zone, which holes or voids have a size of a few nm in depth and a few dozen nm in diameter and which otherwise cannot be fully removed by reconstruction smoothing of the wafer surface during the rapid thermal annealing.

2. The method of claim 1 which further comprises conducting the rapid thermal annealing step in a non-reducing atmosphere.

3. The method of claim 1 wherein the treating comprises conducting high temperature annealing to reconstruct the superficial zone.

4. The method of claim 3 wherein the high temperature annealing is conducted in a neutral atmosphere.

5. The method of claim 3 wherein the high temperature annealing is conducted at a temperature in the range of between about 600° C. and about 1300° C.

6. The method of claim 1 wherein the treating comprises removing a disturbed portion of the superficial zone.

7. The method of claim 6 wherein the disturbed portion is removed by chemical attack.

8. The method of claim 7 wherein the chemical attack includes at least one of wet etching or dry etching.

9. The method of claim 7 wherein the chemical attack includes sacrificial oxidation.

10. The method of claim 9 wherein the sacrificial oxidation includes an oxidation step, a heat treatment step, and a deoxidation step.

11. The method of claim 10 wherein the oxidation step is conducted at a temperature in the range of between about 700° C. and about 1100° C.

12. The method of claim 10 wherein the heat treatment step is conducted under at least one of a constant temperature or a variable temperature.

13. The method of claim 12 wherein the heat treatment step is conducted at a temperature in the range of between about 900° C. and about 1300° C.

14. The method of claim 10 which further comprises beginning the oxidation step with a temperature rise leading to the heat treatment step, and ending the oxidation step before ending the heat treatment step so that the oxidation step at least partially overlaps the heat treatment step.

15. The method of claim 10 wherein the oxidation step converts the superficial zone to oxides and the deoxidation step is conducted in a solution for a time sufficient to remove those oxides.

16. The method of claim 15 wherein the solution is at least one of a 10% or a 20% hydrofluoric acid solution.

17. The method of claim 1 which further comprises a sacrificial oxidation step after the rapid thermal annealing.

18. The method of claim 1 wherein the superficial zone comprises a transferred layer or a grown layer.

19. The method of claim 1 wherein the wafer includes a SOI or a SOA structure.

* * * * *